(12) United States Patent
Wang et al.

(10) Patent No.: US 12,538,414 B2
(45) Date of Patent: Jan. 27, 2026

(54) ANTI-INTERFERENCE MODULE AND TERMINAL DEVICE

(71) Applicant: HONOR DEVICE CO., LTD., Guangdong (CN)

(72) Inventors: Xing Wang, Shenzhen (CN); Lixin Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 527 days.

(21) Appl. No.: 17/925,403

(22) PCT Filed: May 6, 2022

(86) PCT No.: PCT/CN2022/091226
§ 371 (c)(1),
(2) Date: Mar. 2, 2023

(87) PCT Pub. No.: WO2023/024568
PCT Pub. Date: Mar. 2, 2023

(65) Prior Publication Data
US 2024/0224412 A1   Jul. 4, 2024

(30) Foreign Application Priority Data

Aug. 25, 2021 (CN) .......................... 202110985072.6

(51) Int. Cl.
*H03H 7/09* (2006.01)
*H03H 1/00* (2006.01)
(Continued)

(52) U.S. Cl.
CPC ............. *H05K 1/0233* (2013.01); *H03H 7/09* (2013.01); *H05K 9/0071* (2013.01); *H03H 1/0007* (2013.01)

(58) Field of Classification Search
CPC ...... H03H 7/09; H03H 1/0007; H05K 1/0233; H05K 9/0071
(Continued)

(56) References Cited

U.S. PATENT DOCUMENTS 5,914,693 A   6/1999 Takei et al.
10,058,016 B2   8/2018 Guo et al.
(Continued)

FOREIGN PATENT DOCUMENTS

CN   101465659 A   6/2009
CN   103633829 A   3/2014
(Continued)

*Primary Examiner* — Rakesh B Patel

(57) ABSTRACT

An anti-interference module and a terminal device are provided. The anti-interference module includes a circuit board, an interfering source, a device disposing space, and an anti-interference component. The interfering source is disposed on the circuit board, where the interfering source may generate a changing interference magnetic field; the device disposing space is provided on a side of the circuit board and is used to dispose an electronic device with a first coil; and the anti-interference component is configured to generate a compensation magnetic field that overlaps the interference magnetic field, or to consume electric energy generated by coupling between the interference magnetic field and the anti-interference component to reduce magnetic induction intensity of the device disposing space. This application may be applied to the terminal device such as a mobile phone.

19 Claims, 16 Drawing Sheets

(51) Int. Cl.
*H05K 1/02* (2006.01)
*H05K 9/00* (2006.01)

(58) Field of Classification Search
USPC .......................................... 333/175, 177, 181
See application file for complete search history.

(56) References Cited

U.S. PATENT DOCUMENTS

| | | |
|---|---|---|
| 10,673,474 B2 | 6/2020 | Ji |
| 2018/0084681 A1 | 3/2018 | Guo et al. |
| 2019/0069452 A1 | 2/2019 | Jeong |
| 2022/0117077 A1 | 4/2022 | Huang et al. |

FOREIGN PATENT DOCUMENTS

| | | |
|---|---|---|
| CN | 107276599 A | 10/2017 |
| CN | 108282585 A | 7/2018 |
| CN | 108732403 A | 11/2018 |
| CN | 108732404 A | 11/2018 |
| CN | 111586960 A | 8/2020 |
| CN | 213343218 U | 6/2021 |
| CN | 213586258 U | 6/2021 |
| JP | 2015223520 A | 12/2015 |

ANTI-INTERFERENCE MODULE AND TERMINAL DEVICE

CROSS-REFERENCE TO RELATED APPLICATIONS

This application is a National Stage of International Application No. PCT/CN2022/091226, filed on May 6, 2022, which claims priority to Chinese Patent Application No. 202110985072.6, filed on Aug. 25, 2021, both of which are incorporated herein by reference in their entireties.

TECHNICAL FIELD

This application relates to the field of terminal device technologies, and in particular, to an anti-interference module and a terminal device.

BACKGROUND

With the development of electronic technologies, a terminal device such as a mobile phone has more and more functions, and a circuit structure and a layout of electronic devices on a circuit board in the terminal device are becoming increasingly complex, so that the electronic devices are more susceptible to electromagnetic interference. For example, when a radio frequency circuit on the circuit board is operating, a changing magnetic field will be generated around the radio frequency circuit, and the changing magnetic field may be easily coupled to surrounding electronic devices (such as an audio player with an audio coil), and consequently, normal operation of the electronic devices is affected.

SUMMARY

Embodiments of this application provide an anti-interference module and a terminal device, so as to resolve a problem that an electronic device in the terminal device in a related technology is susceptible to interference from a magnetic field of an interfering source on a circuit board.

To achieve the above objective, the embodiments of this application use the following technical solutions:

According to a first aspect, an embodiment of this application provides an anti-interference module, including a circuit board, an interfering source, a device disposing space, and an anti-interference component. The interfering source is disposed on the circuit board, where the interfering source may generate a changing interference magnetic field: the device disposing space is provided on a side of the circuit board and is used to dispose an electronic device with a first coil; and the anti-interference component is configured to generate a compensation magnetic field that overlaps the interference magnetic field, or to consume electric energy generated by coupling between the interference magnetic field and the anti-interference component to reduce magnetic induction intensity of the device disposing space.

By using the solution, the magnetic induction intensity of the device disposing space can be reduced, so as to reduce interference of the interference magnetic field generated by the interfering source to an electronic device, thereby ensuring normal operation of the electronic device. The anti-interference module is mainly aimed at the interfering source that generates the changing magnetic field, and reduces the interference of the changing magnetic field to the electronic device.

In some embodiments, the anti-interference module includes a second coil and a magnetic field shielding element. The second coil is disposed on a side of the device disposing space: and at least a part of the magnetic field shielding element is located between the second coil and the device disposing space.

By using the solution, the second coil can reduce the magnetic induction intensity of the device disposing space by consuming energy generated by coupling between the second coil and the interference magnetic field, generating a compensation magnetic field by the second coil, or the like: and the magnetic field shielding element can shield a magnetic field generated by the second coil, so as to greatly reduce the interference of the changing magnetic field generated by the interfering source to the electronic device.

In some embodiments, the second coil is disposed between the interfering source and the device disposing space.

By using the solution, the magnetic field shielding element can shield not only a magnetic field generated by an induced current in the second coil, but also the interference magnetic field generated by the interfering source, so as to greatly reduce the interference of the interfering source to the electronic device.

In some embodiments, in a thickness direction of the circuit board, the device disposing space is provided on a side of the interfering source away from the circuit board.

By using the solution, the magnetic field shielding element and the second coil can be prevented from occupying an element layout space on the circuit board and on a periphery of the interfering source, thereby facilitating an optimal layout of a component on the circuit board.

In some embodiments, the second coil is a planar coil: and the magnetic field shielding element is layered and is disposed in lamination with the second coil.

By using the solution, sizes of the second coil and the magnetic field shielding element in the thickness direction of the circuit board can be reduced, so as to save space inside a mobile phone housing.

In some embodiments, the interference magnetic field is a low-frequency alternating magnetic field, and a material of the magnetic field shielding element is a permeability magnetic material.

By using the solution, the magnetic field shielding element has a better shielding effect on the low-frequency alternating magnetic field, so that magnetic interference caused to the electronic device in the device disposing space can be better reduced.

In some embodiments, the permeability magnetic material is a nanocrystalline magnetic material.

By using the solution, a magnetic shielding effect of the magnetic field shielding element can be improved.

In some embodiments, the anti-interference component further includes an energy consuming circuit electrically connected to the second coil, and the energy consuming circuit is configured to consume the electric energy generated by coupling between the second coil and the interference magnetic field.

By using the solution, the energy consuming circuit can quickly consume the electric energy generated by coupling between the second coil and the interference magnetic field generated by the interfering source, so as to consume magnetic field energy of the interference magnetic field, thereby reducing the interference of the interfering source to the electronic device.

In some embodiments, the energy consuming circuit is an RLC circuit.

By using the solution, a sudden change of a voltage and a current in the energy consuming circuit may be avoided, so that a resistance element in the RLC circuit can better consume the electric energy generated by coupling between the second coil and the interference magnetic field.

In some embodiments, the interference magnetic field is a high-frequency alternating magnetic field, and the energy consuming circuit includes a bead.

By using the solution, the bead may well convert the electric energy generated by coupling between the second coil and the interference magnetic field into thermal energy for consumption.

In some embodiments, the anti-interference component further includes a charging circuit electrically connected to the second coil, the charging circuit includes a charging connection end, and the charging connection end is configured to be electrically connected to a power supply.

By using the solution, not only the electric energy generated by coupling between the second coil and the interference magnetic field is consumed, and the magnetic induction intensity of the device disposing space is reduced, but also a waste of electric energy on the second coil is avoided, thereby improving endurance of the power supply.

In some embodiments, the anti-interference component further includes a connection circuit electrically connected to the second coil, the connection circuit includes a power supply connection end, and the power supply connection end is configured to be electrically connected to an electrical device.

By using the solution, a waste of electric energy on the second coil is avoided, so as to reduce electric energy of a power supply of a terminal device consumed by an electrical device, thereby improving endurance of the power supply.

In some embodiments, the anti-interference module further includes a first alternating current power supply unit, the first alternating current power supply unit is electrically connected to the second coil, so that the second coil can generate the compensation magnetic field, and a direction in which the compensation magnetic field passes through the second coil is opposite to a direction in which the interference magnetic field passes through the second coil.

By using the solution, magnitude of a current input from the first alternating current supply unit to the second coil may be flexibly controlled based on a strength of the interference magnetic field, so as to control a strength of the compensation magnetic field, so that in the device disposing space, a magnetic flux of the compensation magnetic field can better offset a magnetic flux of the interference magnetic field, thereby reducing the interference of the interference magnetic field to the electronic device.

In some embodiments, the interfering source includes a load, a second alternating current power supply unit, and a connection line connected between the second alternating current power supply unit and the load: and a flow direction of a current in the second coil is opposite to a flow direction of a current in the connection line, where the flow direction includes a clockwise direction and a counterclockwise direction.

By using the solution, a phase of a current flowing into a current circuit can be consistent with a phase of a current flowing into the second coil, so that in the device disposing space, the magnetic flux of the compensation magnetic field can better offset the magnetic flux of the interference magnetic field.

In some embodiments, the anti-interference module further includes a phase modulation device connected between the first alternating current power supply unit and the second coil, and the phase modulation device is configured to adjust a phase of the current in the second coil, so that the phase of the current in the second coil is consistent with a phase of the current in the connection line.

By using the solution, the phase of the current in the second coil can be consistent with the phase of the current in the connection line, so that in the device disposing space, the magnetic flux of the compensation magnetic field can offset the magnetic flux of the interference magnetic field to a maximum extent.

In some embodiments, the phase modulation device includes an induction element.

By using the solution, a requirement of a current phase modulation is met. In addition, a configuration of the phase modulation device is simpler, thereby reducing costs of the anti-interference module.

In some embodiments, the first alternating current power supply unit and the second alternating current power supply unit are a same power supply unit.

By using the solution, the load and the second coil share a power supply unit, so that a quantity of devices on the circuit board can be reduced, thereby saving layout space on the circuit board.

In some embodiments, there are a plurality of loads, and each load is separately connected to the first alternating current power supply unit by using the connection line: the anti-interference module further includes a plurality of branch circuits, and a switching device disposed on each branch circuit: and first ends of the plurality of branch circuits are connected to a plurality of connection lines in a one-to-one correspondence, second ends of the plurality of branch circuits are electrically connected to one end of the second coil, and the other end of the second coil is electrically connected to the second alternating current power supply unit.

By using the solution, when the plurality of loads in the interfering source work simultaneously or sequentially, the interference of the interfering source to the electronic device can be reduced.

In some embodiments, the interfering source includes a load, a second alternating current power supply unit, and a connection line connected between the second alternating current power supply unit and the load: and the anti-interference component includes a compensation line, the compensation line is connected between the second alternating current power supply unit and the load, and a flow direction of a current in the compensation line is opposite to a flow direction of a current in the connection line, where the flow direction includes a clockwise direction and a counterclockwise direction.

By using the solution, in the device disposing space, a magnetic flux of a compensation magnetic field generated by the current in the compensation line can offset a magnetic flux of the interference magnetic field, so that magnetic induction intensity of the device disposing space can be reduced to reduce the interference that the interference magnetic field can cause to the electronic device.

In some embodiments, the anti-interference component further includes a variable resistor, and the variable resistor is disposed on the compensation line.

By using the solution, magnitude of the current in the compensation line may be adjusted by adjusting a resistance value of the variable resistor, so that in device disposing space, the magnetic flux of a compensation magnetic field generated by the current in the compensation line can offset the magnetic flux of the interference magnetic field to a maximum extent.

In some embodiments, a part of the compensation line is disposed close to the device disposing space.

By using the solution, a strength of the compensation magnetic field generated by the current in the compensation line in the device disposing space may be increased, so that the magnetic flux of a compensation magnetic field generated by the current in the compensation line in the component disposing space can better offset the magnetic flux of the interference magnetic field.

According to a second aspect, an embodiment of this application provides a terminal device, including a housing, an electronic device, and the anti-interference module according to the first aspect, where a circuit board of the anti-interference module is disposed in the housing; and the electronic device is disposed in the housing.

Beneficial effects of the terminal device in this embodiment of this application are the same as beneficial effects of the anti-interference module in the first aspect, and details are not described herein again.

In some embodiments, the electronic device is mounted in a device disposing space.

The solution is applicable to an unfoldable terminal device, and the electronic device and the anti-interference module are located in a same housing. In this way, a second coil and a magnetic field shielding element are closer to the electronic device, and therefore the second coil and the magnetic field shielding element can better avoid interference of an interfering source to the electronic device.

In some embodiments, the housing includes a first housing and a second housing connected to the first housing, and the first housing and the second housing may be switched between a folded state and an unfolded state, the circuit board is disposed in the first housing, the electronic device is disposed in the second housing, and when the first housing and the second housing are in the folded state, the electronic device is located in the device disposing space.

The solution is applicable to a foldable terminal device, and the second coil and the magnetic field shielding element can reduce interference of an interfering source to an electronic device located in another housing.

DESCRIPTION OF EMBODIMENTS

In embodiments of this application, the terms "first" and "second" are used for descriptive purposes only, and cannot be construed as indicating or implying relative importance or implicitly indicating the quantity of technical features indicated. Therefore, the features defined with "first" and "second" may explicitly or implicitly include one or more of the features.

In embodiments of this application, it should be noted that the term "electrical connection" should be understood in a broad sense, for example, as a direct connection for current conduction or as a capacitive coupling for electric energy conduction.

A terminal device in embodiments of this application may be a terminal device with internal electromagnetic interference, such as a mobile phone, a tablet, an e-reader, a wearable device, a remote control, a POS (point of sales terminal, point of sales information management system) terminal, a notebook computer, a personal digital assistant (personal digital assistant, PDA), a vehicle-mounted device, or an Internet TV.

The terminal device in embodiments of this application is described below in detail by using the mobile phone as an example. Another type of the terminal device may be specifically configured with reference to a design concept of an anti-interference module in the mobile phone embodiments, and details are not described herein.

Figure 1:
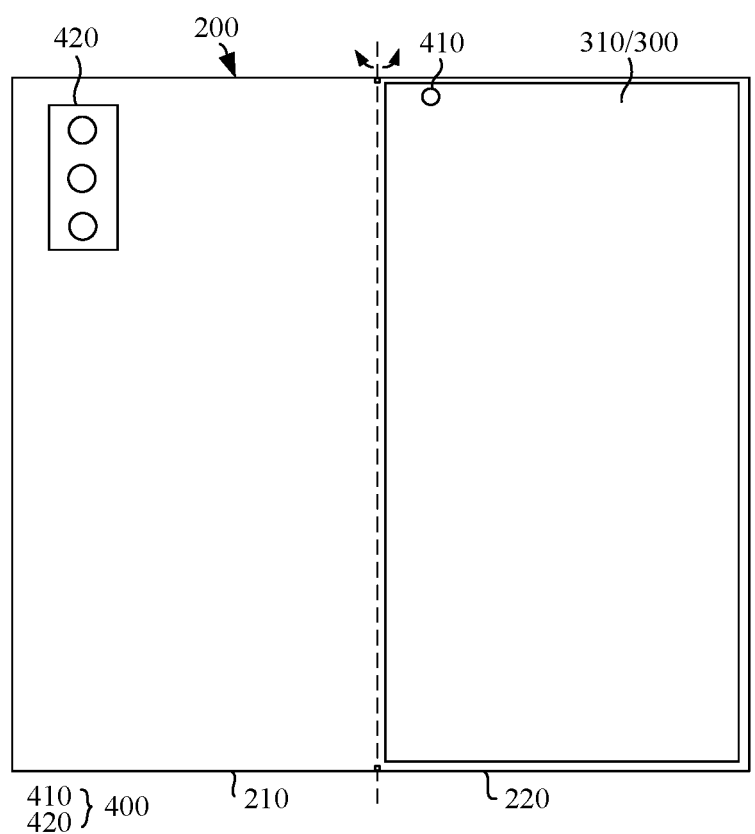
FIG. 1 is an external view of an unfolded mobile phone according to some embodiments of this application.
Figure 2:
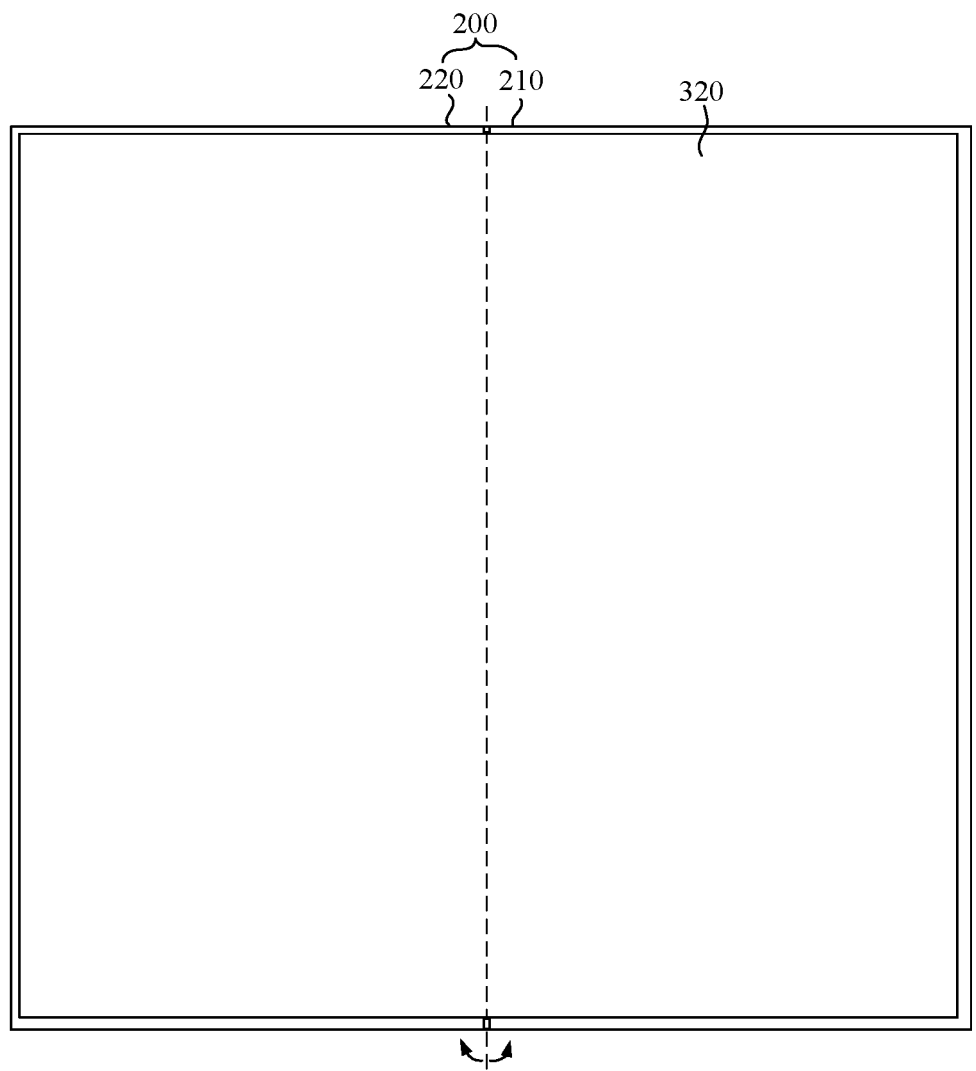
FIG. 2 is an inner view of an unfolded mobile phone in FIG. 1.
Figure 3:
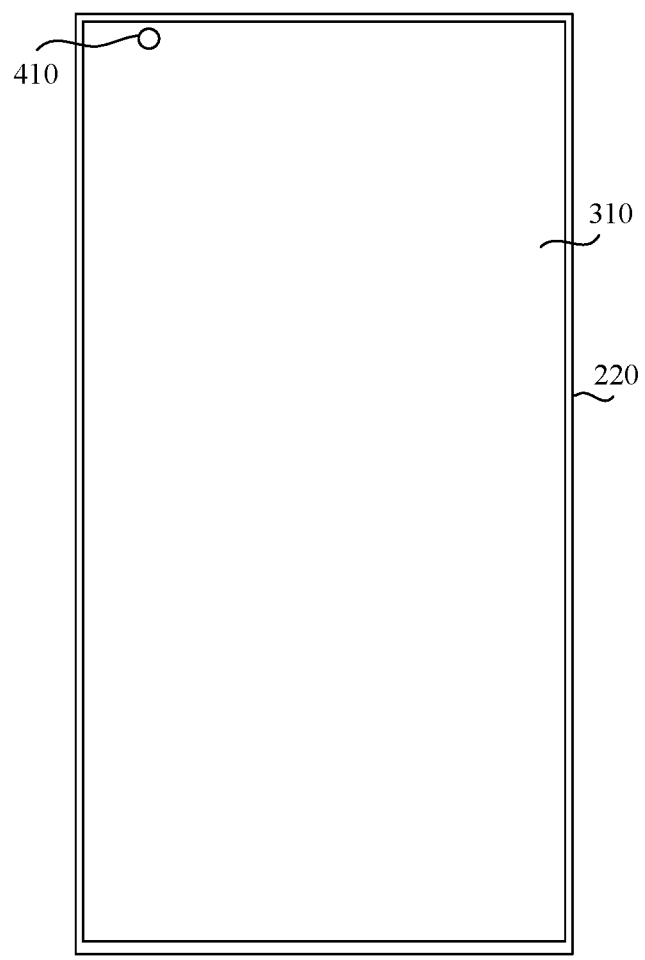
FIG. 3 is a view of a folded mobile phone in FIG. 1.

As shown in FIG. 1, FIG. 2, and FIG. 3, FIG. 1 is an external view of an unfolded mobile phone according to some embodiments of this application, FIG. 2 is an inner view of an unfolded mobile phone in FIG. 1, and FIG. 3 is a view of a folded mobile phone in FIG. 1. The mobile phone is a foldable phone, including a housing 200, a display 300, and a camera 400.

The housing 200 includes a first housing 210 and a second hosing 220 connected to the first housing 210, and the first housing 210 and the second housing 220 may be switched between a folded state and an unfolded state.

The first housing 210 and the second housing 220 may be hinged, and a dashed line in the middle of FIG. 1 and FIG. 2 is an axis of a hinged shaft between the first housing 210 and the second housing 220. However, this is not limited herein. The first housing 210 and the second housing 220 may alternatively be unfolded and folded by using another flexible component.

The display 300 includes an outer display 310 and a main display 320. As shown in FIG. 1, a first housing 210 is on the left side, the second housing 220 is on the right side, and the outer display 310 is disposed on the second housing 220 on the right side. As shown in FIG. 2, the main display 320 is located on a side of the outer display 310 and is disposed on both the first housing 210 and the second housing 220. A display area of the main display 320 is larger than a display area of the outer display 310.

Both the outer display 310 and the main display 320 are flexible displays. For example, both the outer display 310 and the main display 320 are OLED (Organic Light-Emitting Diode, organic light emitting diode) flexible displays.

The camera 400 includes a front-facing camera 410 and a rear-facing camera 420. The rear-facing camera 420 is mounted on the first housing 210, and the front-facing camera 410 is mount on the second housing 220. An avoidance hole is disposed on the outer display 310, and the avoidance hole is used to avoid the front-facing camera 410, so as to ensure normal photographing of the front-facing camera 410.

When a user needs to use a display 300 with a relatively large display area, for example, for watching a film, as shown in FIG. 2, the first housing 210 and the second housing 220 may be adjusted to the unfolded state. In this case, the main display 320 is unfolded, so that the user can obtain a better visual experience because the display area of the main display 320 is relatively large.

When the user goes out with the mobile phone, as shown in FIG. 3, the first housing 210 and the second housing 220 may be adjusted to the folded state. In this case, the mobile phone occupies a relatively small space, so that the mobile phone can be conveniently carried. In addition, when the first housing 210 and the second housing 220 are adjusted to the folded state, the user may also operate the mobile phone by using the outer display 310, so that normal use of the mobile phone is not affected.

Figure 4:
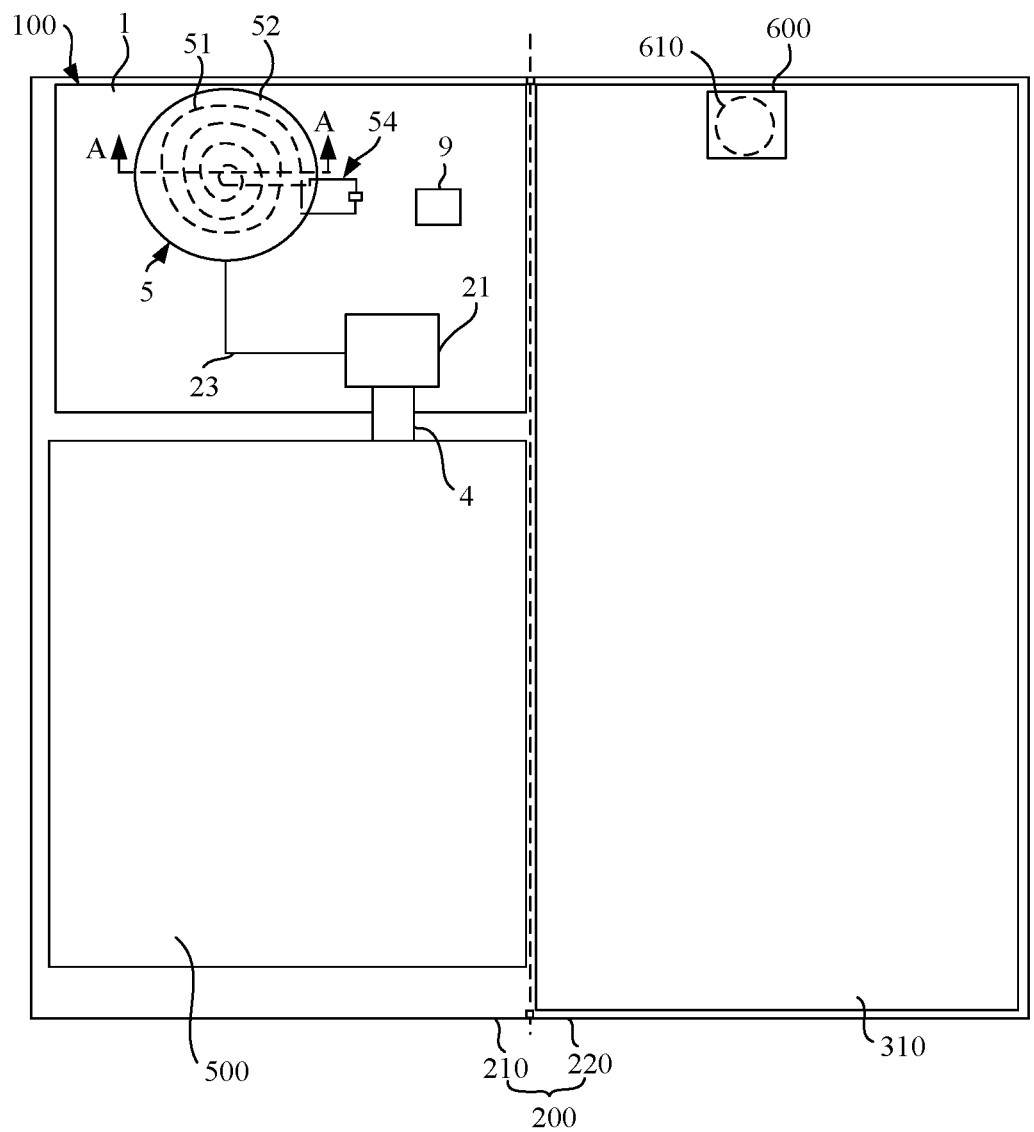
FIG. 4 is a schematic diagram of a structure of a mobile phone in FIG. 2 with a main display removed.
Figure 6:
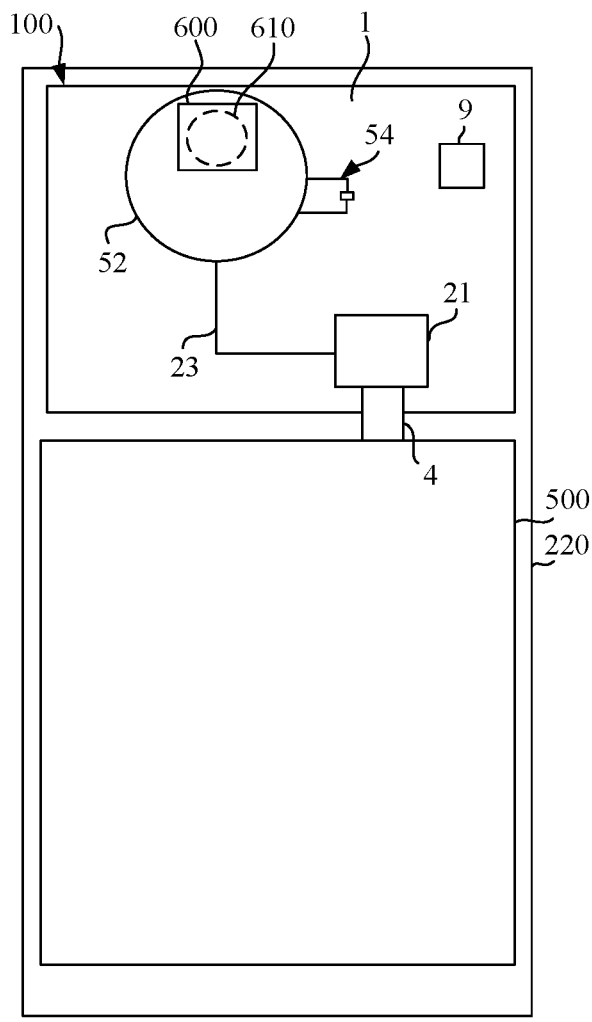
FIG. 6 is a schematic diagram of a structure of a mobile phone in FIG. 3 with an outer display removed.

As shown in FIG. 4 and FIG. 6, FIG. 4 is a schematic diagram of a structure of a mobile phone in FIG. 2 with a main display 320 removed, and FIG. 6 is a schematic diagram of a structure of a mobile phone in FIG. 3 with an outer display 310 removed. The mobile phone further includes a power supply 500, an electronic device 600, and an anti-interference module 100.

The anti-interference module 100 and the power supply 500 are disposed in a second housing 220. The electronic device 600 is an audio player. The audio player is disposed in a first housing 210, and located between the outer display 310 and the main display 320. A first coil 610 (namely, an audio coil) and a diaphragm in contact with the first coil 610 (that is not shown in the figure) are disposed inside the audio player. When the audio player works, the first coil 610 drives the diaphragm to vibrate under action of an electromagnetic field, so that the electronic device 600 makes a sound.

Figure 7:
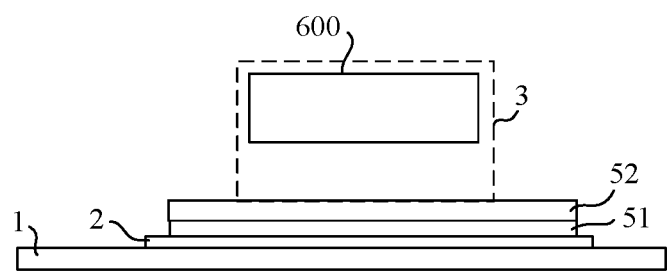
FIG. 7 is a diagram of a position relationship between an anti-interference module and an electronic device in FIG. 6.
Figure 8:
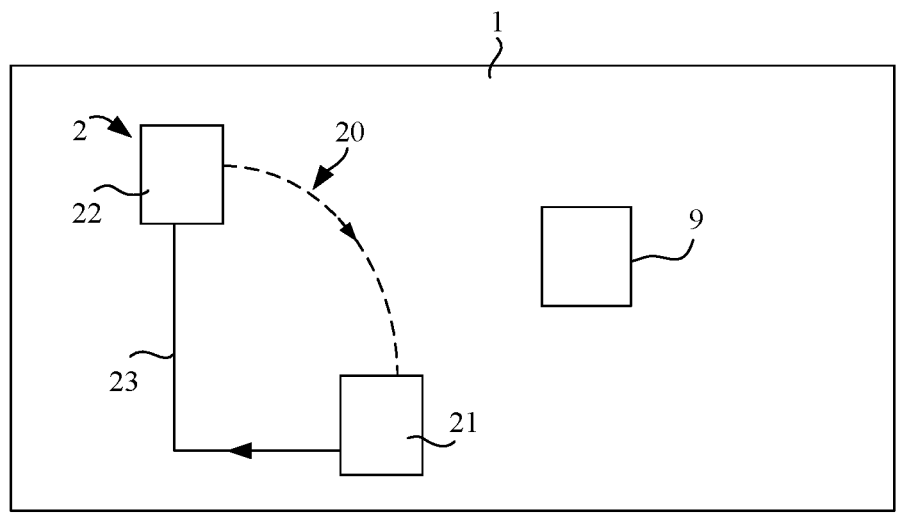
FIG. 8 is a schematic diagram of a structure of an interfering source on a circuit board according to some embodiments of this application.

As shown in FIG. 4 to FIG. 8, FIG. 5 is a cross sectional view taken along A-A of an anti-interference module 100 in FIG. 4, FIG. 7 is a diagram of a position relationship between an anti-interference module 100 and an electronic device 600 in FIG. 6, and FIG. 8 is a schematic diagram of a structure of an interfering source 2 on a circuit board 1 according to some embodiments of this application. The anti-interference module 100 includes the circuit board 1, the interfering source 2, and a device disposing space 3.

Figure 5:
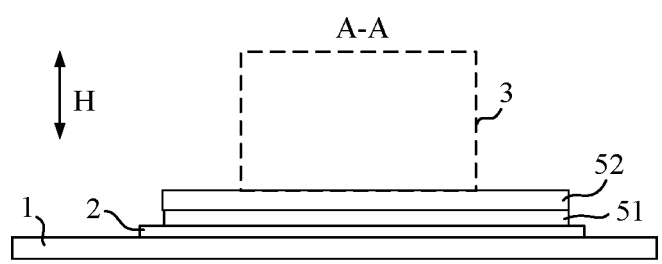
FIG. 5 is a cross sectional view taken along A-A of an anti-interference module in FIG. 4.

The device disposing space 3 is provided on a side of the circuit board 1 and is used to dispose the electronic device 600. As shown in FIG. 4 and FIG. 5, when the first housing 210 and the second housing 220 are in an unfolded state, the electronic device 600 is located outside the device disposing space 3. As shown in FIG. 6 and FIG. 7, when the first housing 210 and the second housing 220 are in a folded state, the electronic device 600 is located in the device disposing space 3.

As shown in the FIG. 6 and FIG. 8, the interfering source 2 is disposed on the circuit board 1, and may generate a changing interference magnetic field. The interfering source 2 is a radio frequency circuit, including a load 22, a second alternating current power supply unit 21, and a connection line 23 connected between the load 22 and the second alternating current power supply unit 21: and the second alternating current power supply unit 21 is electrically connected to the power supply 500 by using an electrical connector 4. The second alternating current power supply unit 21 is a power management integrated circuit, the power supply 500 is a battery of the mobile phone, the load 22 is a radio frequency power amplifier, and the radio frequency power amplifier is configured to be electrically connected to an antenna of the mobile phone.

When the interfering source 2 works, the second alternating current power supply unit 21 supplies energy to the load 22 by using the connection line 23, and the energy flows back to the second alternating current power supply unit 21 through a ground-plane path (as shown by a dashed line in FIG. 8) to form a current circuit 20. Generally, a current change of 1-2 A or even higher occurs on the current circuit 20, a changing waveform is similar to a square wave, and a period is generally around 200 Hz to 800 Hz. Based on Faraday's law of electromagnetic induction, a changing current will generate a changing interference magnetic field. In this case, the interference magnetic field is a low-frequency alternating magnetic field. When the first housing 210 and the second housing 220 are in the folded state, the interference magnetic field can be coupled to the first coil 610 of the electronic device 600, and an induced electromotive force will be generated in the first coil 610, causing current noise audible to human ear. Consequently, the electronic device 600 cannot work properly.

To reduce interference of the interfering source 2 to the electronic device 600, as shown in FIG. 4 and FIG. 5, the anti-interference module 100 further includes an anti-interference component 5, the anti-interference component 5 includes a second coil 51 and a magnetic field shielding element 52, the second coil 51 is disposed on a side of the device disposing space 3, and the magnetic field shielding element 52 is disposed between the second coil 51 and the device disposing space 3.

The anti-interference component 5 includes the second coil 51, so that magnetic induction intensity of the device disposing space 3 can be reduced by consuming energy generated by coupling between the second coil 51 and the interference magnetic field, or by generating the interference magnetic field and a compensation magnetic field by the second coil 51. In addition, the magnetic field shielding element 52 is further disposed between the second coil 51 and the device disposing space 3, so that the magnetic field shielding element 52 can shield a magnetic field generated by the second coil 51 (the second coil 51 is coupled to the interference magnetic field to generate an induced current, and the induced current causes the second coil 51 to generate the magnetic field). Therefore, by disposing the second coil 51 and the magnetic field shielding element 52, interference that of a changing magnetic field generated by the interfering source 2 to the electronic device 600 may be greatly reduced, thereby ensuring normal operation of the electronic device 600.

Certainly, the interfering source 2 is also not limited to the radio frequency circuit, and may alternatively be another circuit or device that can generate the changing magnetic field, such as a circuit with an inductance coil. The foregoing load 22 is also not limited to the radio frequency power amplifier, and may be specifically determined based on a type of a circuit. The interference magnetic field generated by the interfering source 2 is also not limited to the low-frequency alternating magnetic field, and may alternatively be a high-frequency alternating magnetic field, or may be a changing magnetic field with a constant direction and changing magnitude.

In some embodiments, as shown in FIG. 4 and FIG. 5, the second coil 51 is disposed between the interfering source 2 and the device disposing space 3. In this way, the second coil 51 is closer to the interfering source 2, and therefore magnetic induction intensity after the interference magnetic field passes through the second coil 51 may be better reduced, so as to reduce the interference of the interference magnetic field generated by the interfering source 2 to the electronic device 600. In addition, the magnetic field shielding element 52 is located between the interfering source 2 and the device disposing space 3. In this way, the magnetic field shielding element 52 can shield not only the magnetic field generated by the induced current in the second coil 51, but also the interference magnetic field generated by the interfering source 2. Therefore, the interference of the interfering source 2 to the electronic device 600 can be greatly reduced.

The second coil 51 may be located between the load 22 and the device disposing space 3, or between a line connecting the load 22 and the second alternating current power supply unit 21 and the device disposing space 3. This is not specifically limited herein.

In some embodiments, as shown in FIG. 4 and FIG. 5, in a thickness direction H of the circuit board 1, the device disposing space 3 is provided on a side of the interfering source 2 away from the circuit board 1. In this case, the magnetic field shielding element 52 and the second coil 51 are located on the side of the interfering source 2 away from the circuit board 1. In this way, the magnetic field shielding element 52 and the second coil 51 can be prevented from occupying an element layout space located on the circuit board 1 and on a periphery of the interference source 2, thereby facilitating an optimal layout of an element on the circuit board 1.

In some embodiments, as shown in FIG. 4 and FIG. 5, the second coil 51 is a planar coil, and the magnetic field shielding element 52 is layered and is disposed in lamination with the second coil 51. Based on such disposing, sizes of the magnetic field shielding element 52 and the second coil 51 in the thickness direction of the circuit board 1 can be reduced, so as to save space in the mobile phone housing 200, thereby facilitating an optimal layout of a device in the mobile phone housing 200.

Certainly, in addition to being located between the interfering source 2 and the device disposing space 3, as shown in FIG. 8, the second coil 51 may alternatively be located in an area enclosed by the current circuit 20 in the interfering source 2: and in this case, it is necessary to ensure that the electronic device 600 on the circuit board 1 is orthographically projected into the area enclosed by current circuit 20. The second coil 51 may alternatively be a solenoid coil in addition to the planar coil, and the magnetic field shielding element 52 may alternatively be another shape in addition to being layered. For example, the magnetic field shielding element 52 may be shaped like a cover to cover the interfering source 2 and the second coil 51: and in this case, a part of the cover (to be specific, an upper wall of the cover) is located between the second coil 51 and the device disposing space 3.

In some embodiments, the interference magnetic field generated by the interfering source 2 is the low-frequency alternating magnetic field, and a material of the magnetic field shielding element 52 is a permeability magnetic material. When a magnetic line of the low-frequency alternating magnetic field passes through the permeability magnetic material, the permeability magnetic material can confine the magnetic line inside the permeability magnetic material, to avoid that the magnetic field line passes through the magnetic field shielding element 52, so that the magnetic field shielding element 52 has a better shielding effect on the low-frequency alternating magnetic field, thereby better reducing magnetic interference to the electronic device 600 in the device disposing space 3.

A low-frequency alternating magnetic field shielded by the magnetic field shielding element 52 may be a magnetic field that is generated by an induced current generated by the coupling between the second coil 51 and the interference magnetic field, or may be the interference magnetic field generated by the interfering source 2.

It should be noted that when the interference magnetic field generated by the interfering source 2 is the low-frequency alternating magnetic field, the induced current in the second coil 51 is a low-frequency alternating current, and in this case, the induced current in the second coil 51 also generates the low-frequency alternating magnetic field: or when the interference magnetic field generated by interfering source 2 is the high-frequency alternating magnetic field, the induced current in the second coil 51 is a high-frequency alternating current, and in this case, the induced current in the second coil 51 also generates the high-frequency alternating magnetic field.

In some embodiments, the permeability magnetic material is a nanocrystalline magnetic material. For example, the nanocrystalline magnetic material may be an iron-based nanocrystalline soft magnetic material, and the material is an amorphous magnetic material composed of five metal materials: iron, silicon, boron, copper, and niobium.

The nanocrystalline magnetic material has an excellent magnetic property because of a special structure characteristic of the nanocrystalline magnetic material, so that the nanocrystalline magnetic material can better prevent the magnetic line from passing through the magnetic field shielding element 52, and therefore a magnetic shielding effect of the magnetic field shielding element 52 can be improved.

In addition to the nanocrystalline magnetic material, the permeability magnetic material may be ferrite, iron-silicon alloy (also referred to as a silicon steel sheet), or the like.

When the interference magnetic field generated by the interfering source 2 is the high-frequency alternating magnetic field, the material of the magnetic field shielding element 52 may alternatively be a metal material with good electrical conductivity, such as copper or aluminum. When the high-frequency alternating magnetic field passes through the magnetic field shielding element 52, a very high eddy current can be caused on the magnetic field shielding element 52. Because of a demagnetizing effect of the eddy current, the high-frequency alternating magnetic field cannot pass through the magnetic field shielding element 52, and therefore the high-frequency alternating magnetic field has the shielding effect on the magnetic field shielding member 52.

The high-frequency alternating magnetic field shielded by the magnetic field shielding element 52 may be the magnetic field that is generated by an induced current generated by the coupling between the second coil 51 and the interference magnetic field, or may be the interference magnetic field generated by the interfering source 2.

Figure 9:
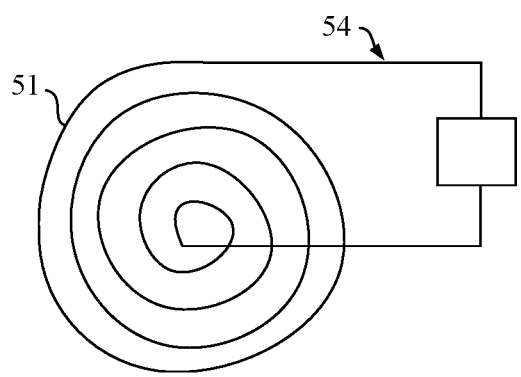
FIG. 9 is a schematic diagram of a connection between an electromagnetic coil and an energy consuming circuit according to some embodiments of this application.
Figure 10:
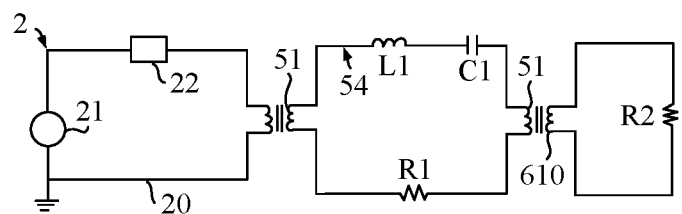
FIG. 10 is a diagram of an equivalent circuit of an anti-interference module in FIG. 4 and FIG. 5.

A manner in which the second coil 51 reduces the magnetic induction intensity of the device disposing space 3 is not unique. FIG. 6, FIG. 9, and FIG. 10 show an embodiment of a first manner of reducing the magnetic induction intensity of the device disposing space 3. FIG. 9 is a schematic diagram of a connection between a second coil 51 and an energy consuming circuit 54 according to some embodiments of this application: and FIG. 10 is a diagram of an equivalent circuit of an anti-interference module 100 in FIG. 4 and FIG. 5. In this embodiment, the anti-interference component 5 further includes the energy consuming circuit 54 electrically connected to the second coil 51, and the energy consuming circuit 54 is configured to consume the electric energy generated by coupling between the second coil 51 and the interference magnetic field. In this way, the energy consuming circuit 54 can quickly consume the electric energy generated by coupling between the second coil 51 and the interference magnetic field generated by the interfering source 2, so as to consume magnetic field energy of the interference magnetic field, thereby reducing the interference of the interfering source 2 to the electronic device 600.

The energy consuming circuit 54 is not unique. In some embodiments, as shown in FIG. 10, the energy consuming circuit 54 is an RLC circuit. An inductance element L1 in the RLC circuit can be used for current stabilization, and a capacitance element C1 in the RLC circuit can be used for voltage stabilization. In this way, a sudden change of a voltage and a current in the energy consuming circuit 54 may be avoided, so that a resistance element R2 in the RLC circuit can better consume the electric energy generated by coupling between the second coil 51 and the interference magnetic field.

The RLC circuit may be an RLC series circuit, for example, the inductance element L1, the capacitance element C1, and the resistance element R2 in FIG. 10 are connected in series. However, this is not limited herein. The RLC circuit may alternatively be an RLC parallel circuit, provided that electric energy generated by the second coil 51 can be consumed. This is not specifically limited herein.

In some other embodiments, the energy consuming circuit 54 includes a bead. The bead has a very high resistivity and magnetic permeability, and is equivalent to a series connection of a resistor and an inductor, but both a resistance value and an inductance value of the bead change with frequency, and the bead is resistive at a high frequency. Therefore, when the interference magnetic field generated by the interfering source 2 is the high-frequency alternating magnetic field, the second coil 51 is coupled to the interference magnetic field to generate the high-frequency alternating current. In this case, a resistive bead can better convert the electric energy in the second coil 51 into thermal energy for consumption.

Certainly, in addition to composition shown in FIG. 10, the energy consuming circuit 54 may alternatively be a pure resistance circuit.

Certainly, in addition to consuming the electric energy generated by coupling by using the energy consuming circuit 54, resistance of the second coil 51 may alternatively be used to consume the electric energy generated by coupling between the interference magnetic field and the second coil 51.

Figure 11:
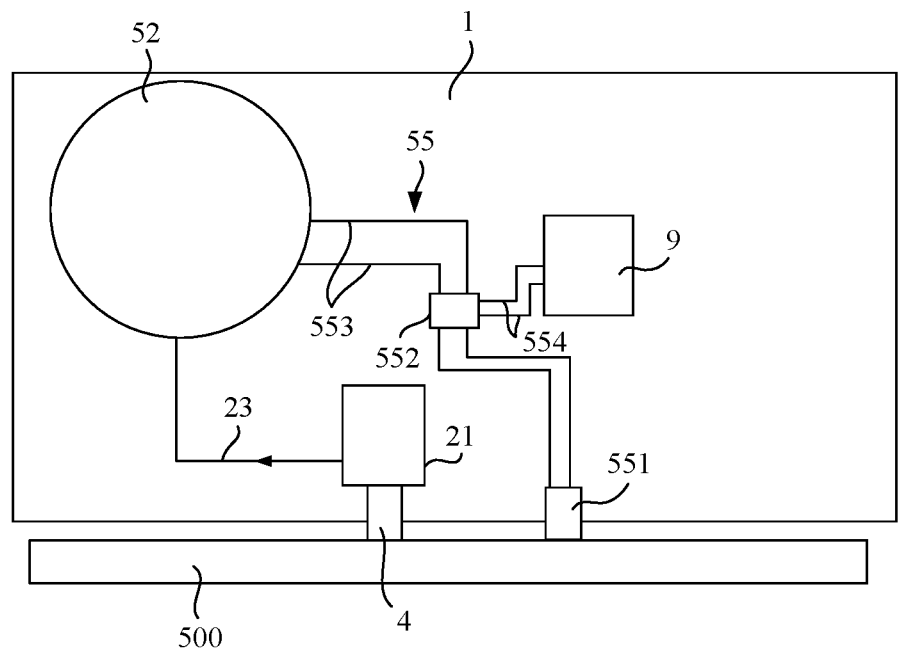
FIG. 11 is a schematic diagram of a structure of an anti-interference module according to some other embodiments of this application.
Figure 12:
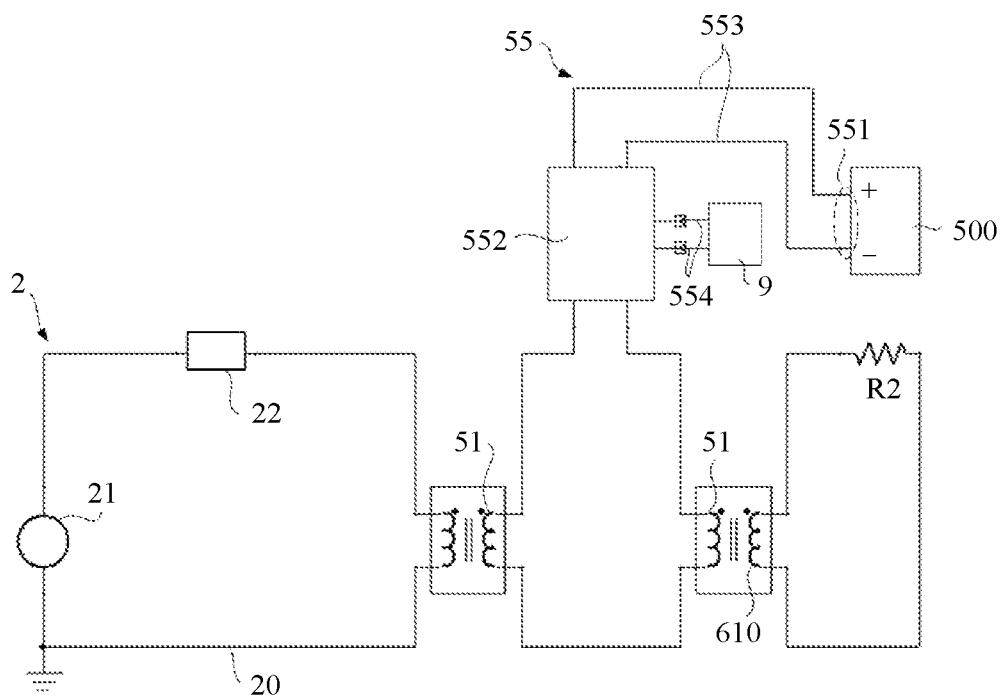
FIG. 12 is a diagram of an equivalent circuit of an anti-interference module in FIG. 11.

FIG. 11 and FIG. 12 show an embodiment of a second manner of reducing the magnetic induction intensity of the device disposing space 3. FIG. 11 is a schematic diagram of a structure of an anti-interference module 100 according to some other embodiments of this application: and FIG. 12 is a diagram of an equivalent circuit of an anti-interference module 100 in FIG. 11. In this embodiment, the anti-interference component 5 further includes a charging circuit 55 electrically connected to the second coil 51, the charging circuit 55 includes a charging connection end 551, and the charging connection end 551 is configured to be electrically connected to the power supply 500.

By disposing the charging circuit 55, the power supply 500 may be charged by using the induced current generated by the coupling between the second coil 51 and the interference magnetic field generated by the interfering source 2. In this way, the electric energy generated by coupling between the second coil 51 and the interference magnetic field is consumed, so that the magnetic induction intensity of the device disposing space 3 is reduced: in addition, a waste of the electric energy in the second coil 51 is avoided, thereby improving endurance of the power supply 500.

As shown in FIG. 12, the charging circuit 55 includes a first alternating current-direct current converter 552, a charging line 553, and a first control line 554. The charging line 553 is connected between the second coil 51 and the charging connection end 551. The first alternating current-direct current converter 552 is disposed on the charging line 553, and is connected to a processor 9 on the circuit board 1 by using the first control line 554. The processor 9 may control, by using the first alternating current-direct current converter 552, the charging circuit 55 to charge the power supply 500.

Figure 13:
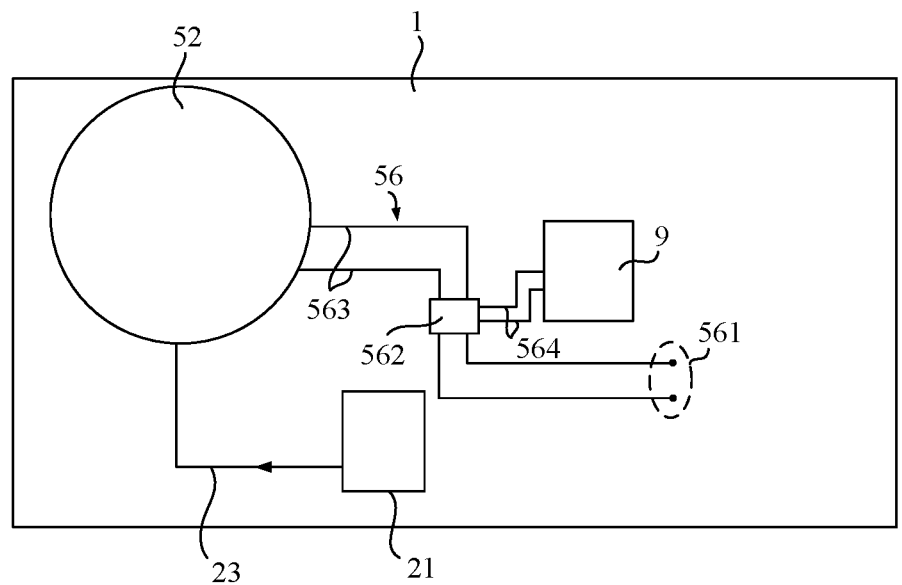
FIG. 13 is a schematic diagram of a structure of an anti-interference module according to some other embodiments of this application.
Figure 14:
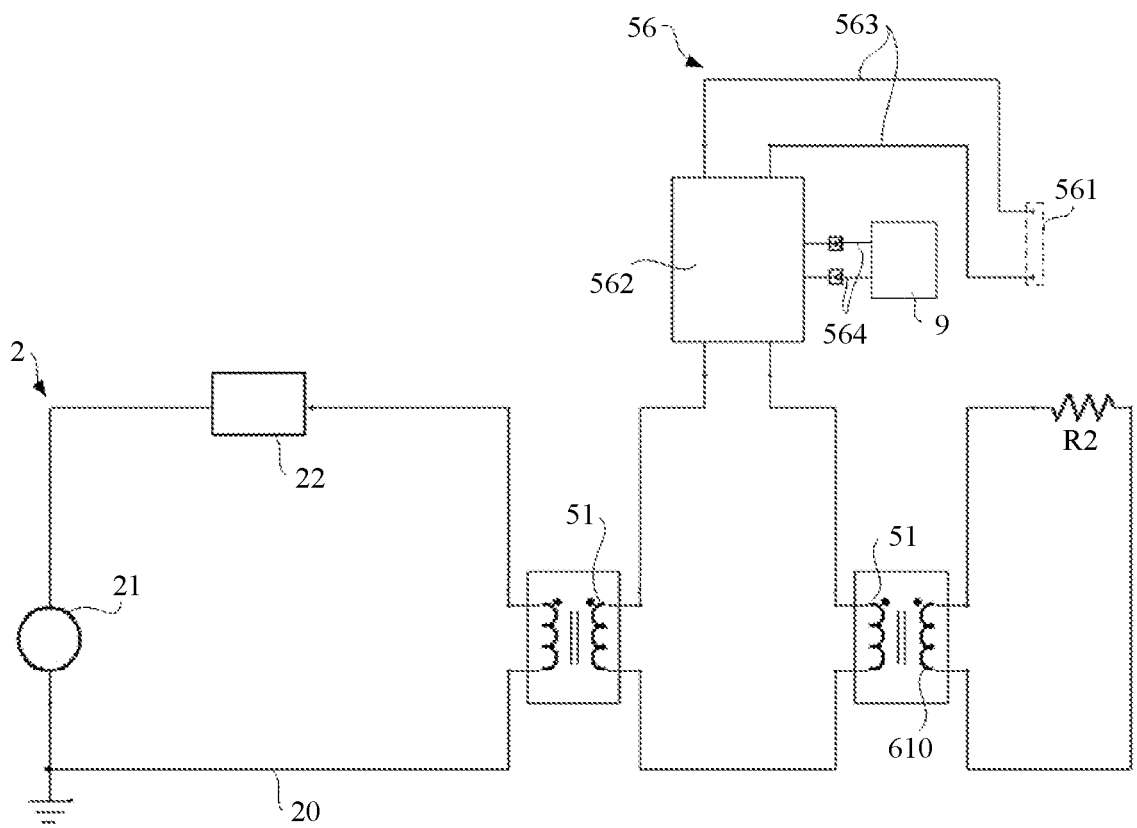
FIG. 14 is a diagram of an equivalent circuit of an anti-interference module in FIG. 13.
Figure 15:
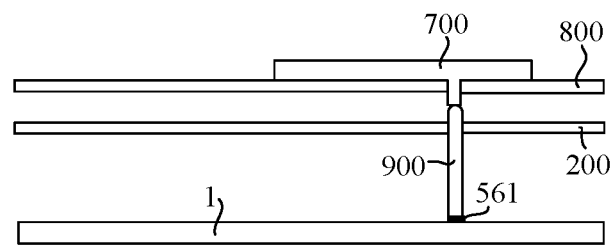
FIG. 15 is a schematic diagram of a connection between an anti-interference module in FIG. 13 and an electrical device.

FIG. 13, FIG. 14, and FIG. 15 show an embodiment of a third manner of reducing the magnetic induction intensity of the device disposing space 3. FIG. 13 is a schematic diagram of a structure of an anti-interference module 100 according to some other embodiments of this application: FIG. 14 is a diagram of an equivalent circuit of an anti-interference module 100 in FIG. 13: and FIG. 15 is a schematic diagram of a connection between an anti-interference module 100 in FIG. 13 and an electrical device 700. In this embodiment, the anti-interference component 5 further includes a connection circuit 56 electrically connected to the second coil 51, the connection circuit 56 includes a power supply connection end 561, and the power supply connection end 561 is configured to be electrically connected to the electrical device 700.

By disposing the connection circuit 56, the electrical device 700 may be charged by using the induced current generated by the coupling between the second coil 51 and the interference magnetic field generated by the interfering source 2. In this way, the electric energy generated by coupling between the second coil 51 and the interference magnetic field is consumed, so that the magnetic induction intensity of the device disposing space 3 is reduced: in addition, a waste of the electric energy on the second coil 51 is avoided, so that electric energy of the power supply 500 of the mobile phone that is consumed by the electrical device 700 is reduced, thereby improving endurance of the power supply 500.

As shown in FIG. 15, the electrical device 700 may be a fill light disposed on a protective housing 800 of the mobile phone, and the fill light may fill light for photographing of the mobile phone. Certainly, in addition to the fill light, the electrical device 700 may be a decorative light disposed on the protective housing 800, or the like.

As shown in FIG. 14, the connection circuit 56 includes a second alternating current-direct current converter 562, a power supply line 563, and a second control line 564. The power supply line 563 is connected between the second coil 51 and the power supply connection end 561. The second alternating current-direct current converter 562 is disposed on the power supply line 563, and is connected to the processor 9 by using a control line 724. The processor 9 may control, by using the second alternating current-direct current converter 562, the connection circuit 56 to supply power to the electrical device 700.

The power supply connection end 561 may be electrically connected to a connector 900 (for example, pogo pin), or may be electrically connected to the electrical device 700 by using a conductor. This is not specifically limited herein.

Figure 16:
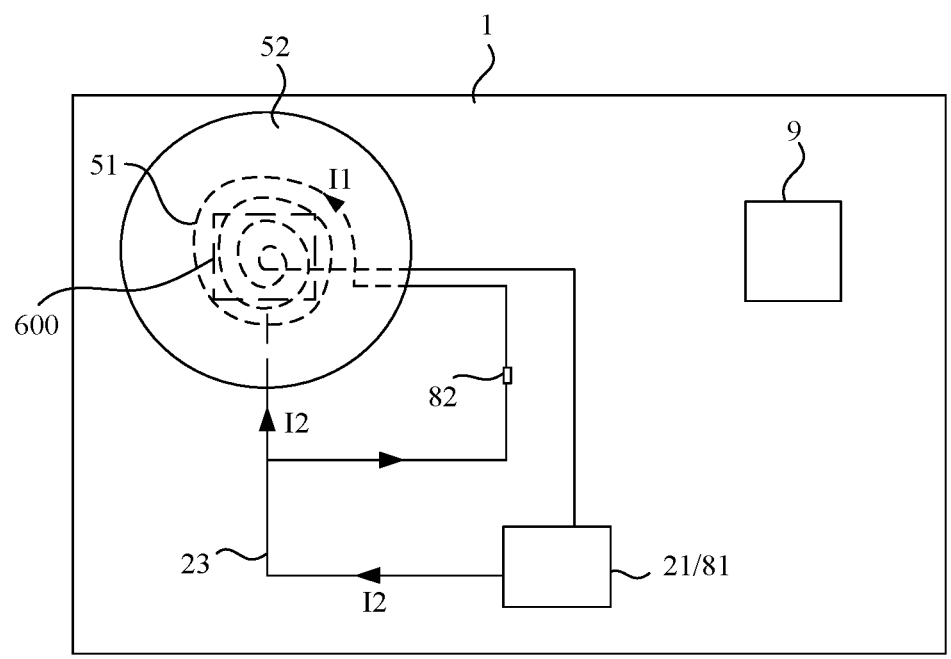
FIG. 16 is a schematic diagram of a structure of an anti-interference module according to some other embodiments of this application.
Figure 17:
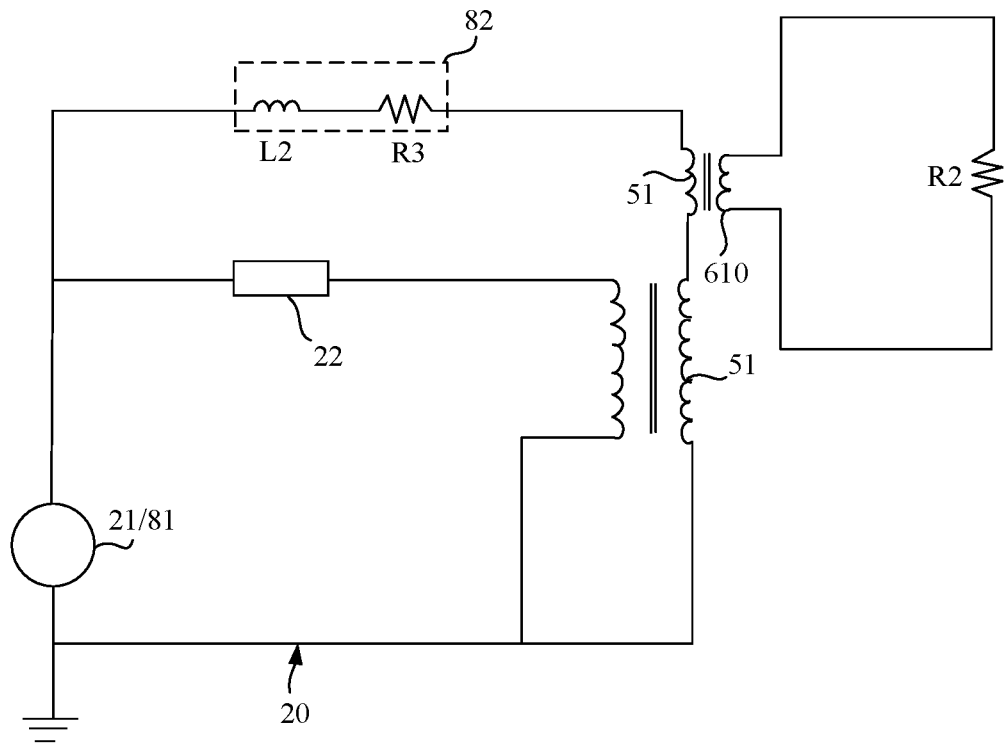
FIG. 17 is a diagram of an equivalent circuit of an anti-interference module in FIG. 16.

FIG. 16 and FIG. 17 show an embodiment of a fourth manner of reducing the magnetic induction intensity of the device disposing space 3. FIG. 16 is a schematic diagram of a structure of an anti-interference module 100 according to some other embodiments of this application, an arrow in FIG. 16 is a current flow direction at a moment: and FIG. 17 is a diagram of an equivalent circuit of an anti-interference module 100 in FIG. 16. In this embodiment, the anti-interference module 100 further includes a first alternating current power supply unit 81: the first alternating current power supply unit 81 is electrically connected to the second coil 51, so that the second coil 51 can generate the compensation magnetic field: a direction in which the compensation magnetic field passes through the second coil 51 is opposite to a direction in which the interference magnetic field passes through the second coil 51: and the first alternating current power supply unit 81 and the second alternating current power supply unit 21 are a same power supply unit.

Specifically, as shown in FIG. 16 and FIG. 17, a flow direction of a current I1 in the second coil 51 is opposite to a flow direction of a current I2 in the connection line 23. The flow direction includes a clockwise direction and a counterclockwise direction.

It can be learned from FIG. 16 that, at a moment, the flow direction of a current I2 in the connection line 23 of the interfering source 2 is clockwise, a direction of an interference magnetic field generated by the current I2 in the connection line 23 is perpendicular to a display inward: and the flow direction of a current I1 in the second coil 51 is counterclockwise, and a direction of a compensation magnetic field generated by the current in the second coil 51 is perpendicular to the display outward. In this way, the interference magnetic field and the compensation magnetic field are in opposite directions. Therefore, a magnetic flux of a compensation magnetic field in the device disposing space 3 can offset a magnetic flux of the interference magnetic field, thereby reducing the interference of the interference magnetic field to the electronic device 600.

That the direction in which the compensation magnetic field passes through the second coil 51 is opposite to the direction in which the interference magnetic field passes through the second coil 51 means that at each moment, and the direction in which the compensation magnetic field passes through the second coil 51 is opposite to the direction in which the interference magnetic field passes through the second coil 51.

The first alternating current power supply unit 81 is disposed to supply power to the second coil 51 to generate a reverse compensation magnetic field. In this way, magnitude of a current input from the first alternating current power supply unit 81 to the second coil 51 may be flexibly controlled based on a strength of the interference magnetic field, so as to control a strength of the compensation magnetic field. Therefore, in the device disposing space 3, the magnetic flux of the compensation magnetic field can offset the magnetic flux of the interference magnetic field, so as to reduce the magnetic flux of the interference magnetic field, thereby reducing the interference of the interference magnetic field to the electronic device 600.

In addition, the second alternating current power supply unit 21 and the first alternating current power supply unit 81 are the same power supply unit: that is, the load 22 and the second coil 51 share one power supply unit. In this way, a phase of the current I2 flowing into the connection line 23 can be consistent with a phase of the current I1 flowing into the second coil 51. Therefore, in the device disposing space 3, the magnetic flux of the compensation magnetic field can better offset the magnetic flux of the interference magnetic field, thereby reducing the interference of the interference magnetic field to the electronic device 600. In addition, the second alternating current power supply unit 21 and the first alternating current power supply unit 81 are a same component, so as to reduce a quantity of devices on the circuit board 1, thereby saving layout space on the circuit board 1.

Certainly, in some other embodiments, the second alternating current power supply unit 21 and the first alternating current power supply unit 81 may alternatively be disposed separately. To be specific, the load 22 and the second coil 51 are separately powered by different power supply units.

In some embodiments, as shown in FIG. 16 and FIG. 17, the anti-interference module 100 further includes a phase modulation device 82 connected between the first alternating current power supply unit 81 and the second coil 51, and the phase modulation device 82 is configured to adjust a phase of the current I1 in the second coil 51, so that the phase of the current I1 in the second coil 51 is consistent with the phase of the current I2 in the connection line 23.

The second coil 51 is equivalent to an inductor after being powered on, and can block, to some extent, the current that passes through the second coil 51, so that the phase of the current I1 passing through the second coil 51 lags the phase of the current I2 in the connection line 23 in the interfering source 2. In this way, when the current I2 in the connection line 23 in the interfering source 2 is on a wave crest, the current I1 in the second coil 51 does not reach the wave crest. Consequently, in the device disposing space 3, the magnetic flux of the compensation magnetic field cannot offset the magnetic flux of the interference magnetic field to a maximum extent. By disposing the phase modulation device 82, the phase of the current I1 can be consistent with the phase of the current I2. In this way, when the current I2 in the connection line 23 is on the wave crest, the current I1 in the second coil 51 is also on the wave crest, so that in the device disposing space 3, the magnetic flux of the compensation magnetic field can offset the magnetic flux of the interference magnetic field to the maximum extent, and further the interference of the interference magnetic field to the electronic device 600 is minimized.

In some embodiments, as shown in FIG. 16 and FIG. 17, the phase modulation device 82 includes an inductance element L2. In this way, the current I1 that passes through the second coil 51 may be further lagged by the inductance element L2 of the phase modulation device 82, so that the phase of the current I1 passing through the second coil 51 lags the phase of the current I2 in the connection line 23 in the interfering source 2 by 360 degrees, that is, the phase of the current I1 is consistent with a phase of the current I2. By disposing the inductance element L2, a requirement of a current phase modulation is met: in addition, a configuration of the phase modulation device 82 is simpler, thereby reducing costs of the anti-interference module.

In some embodiments, as shown in FIG. 16 and FIG. 17, the phase modulation device 82 further includes a resistance element R3, and the resistance element R3 and the inductance element L2 are connected in series. In this way, the resistance element R3 can adjust the magnitude of the current flowing into the second coil 51, so as to prevent an excessive current from flowing into the second coil 51.

Certainly, if the phase of the current I1 in the second coil 51 and a phase of a current I2 in the current circuit 20 can be well controlled, the phase modulation device 82 may not be disposed.

Figure 18:
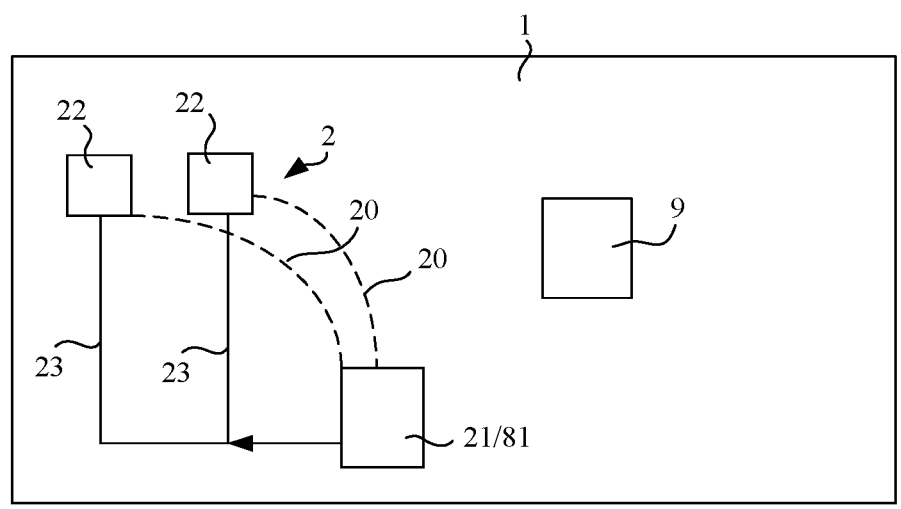
FIG. 18 is a schematic diagram of a circuit board according to some embodiments of this application.
Figure 19:
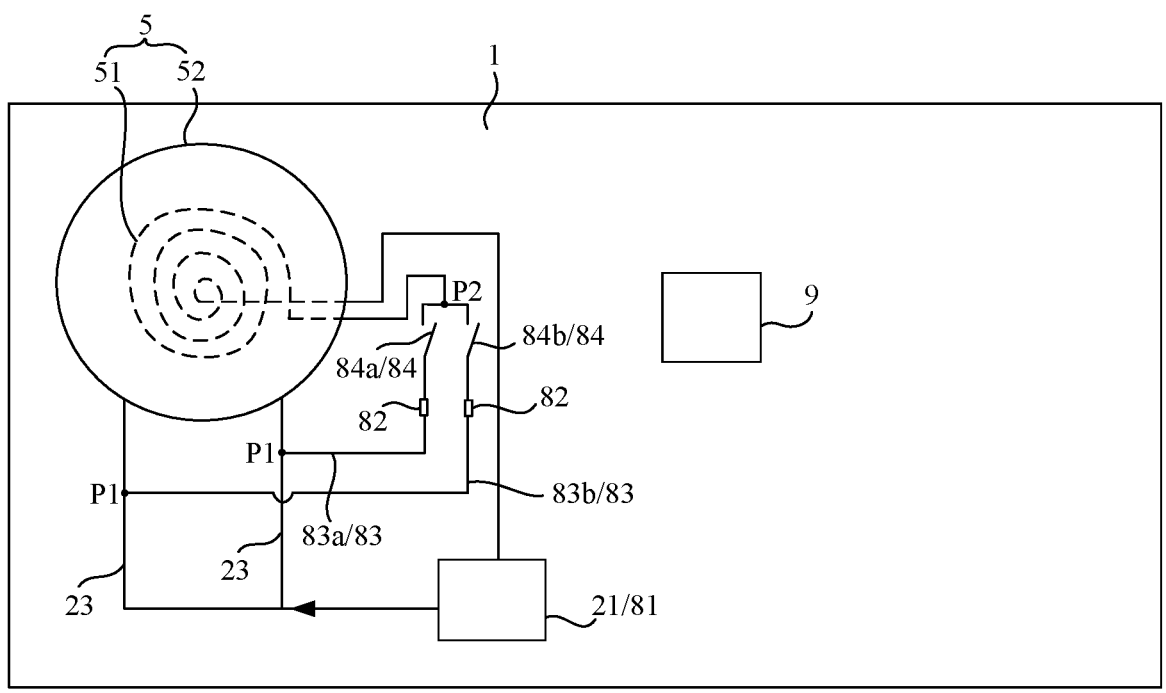
FIG. 19 is a schematic diagram of a structure of an anti-interference module according to some other embodiments of this application.
Figure 20:
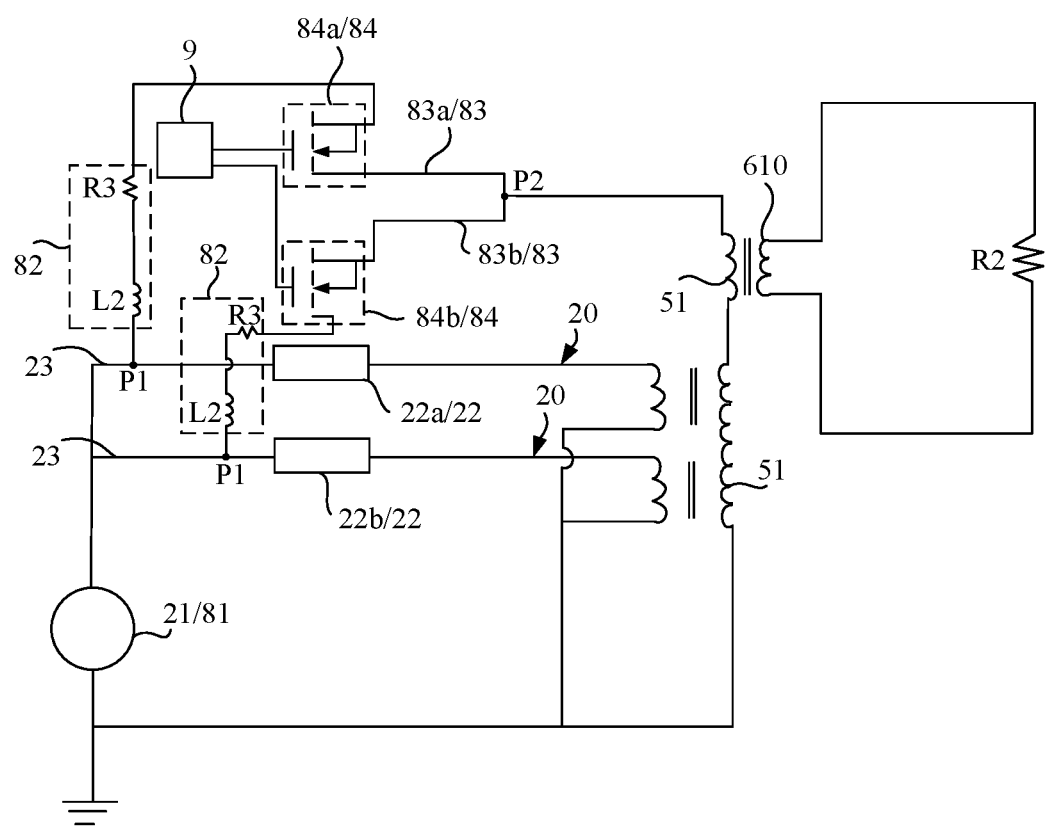
FIG. 20 is a diagram of an equivalent circuit of an anti-interference module in FIG. 19.

In some embodiments, as shown in FIG. 18, FIG. 19, and FIG. 20, FIG. 18 is a schematic diagram of a circuit board 1 according to some embodiments of this application: FIG. 19 is a schematic diagram of a structure of an anti-interference module 100 according to some other embodiments of this application: and FIG. 20 is a diagram of an equivalent circuit of an anti-interference module 100 in FIG. 19. There are a plurality of loads 22 (two are shown in the figure), and each load 22 is separately connected to the first alternating current power supply unit 81 by using the connection line 23.

The anti-interference module 100 further includes a plurality of branch circuits 83 (two are shown in the figure) and a switching device 84 disposed on each branch circuit 83. First ends P1 of the plurality of branch circuits 83 are connected to a plurality of connection lines 23 in a one-to-one correspondence, second ends P2 of the plurality of branch circuits 83 are electrically connected to one end of a second coil 51, and the other end of the second coil 51 is electrically connected to the second alternating current power supply unit 21.

When a load 22a works, a switching device 84a causes a branch circuit 83a to be conducted, so that the direction of a compensation magnetic field generated by the second coil 51 is opposite to a direction of an interference magnetic field generated by the current circuit 20 in which the load 22a is located, so as to reduce the magnetic induction intensity of the device disposing space 3. When a load 22b works, a switching device 84b causes a branch circuit 83b to be conducted, so that the direction of a compensation magnetic field generated by the second coil 51 is opposite to a direction of an interference magnetic field generated by the current circuit 20 in which the load 22b is located, so as to reduce the magnetic induction intensity of the device disposing space 3.

The switching device 84 is disposed on each branch circuit 83. In this way, the switching device 84 may open the branch circuit 83 corresponding to the load 22, so that the direction of the compensation magnetic field generated by the second coil 51 is opposite to the direction of the interference magnetic field generated by the current circuit 20 corresponding to the load 22, and interference to the electronic device 600 when the plurality of loads 22 separately work can be well reduced.

Based on the foregoing disposing, when the plurality of loads 22 in the interfering source 2 work simultaneously or sequentially, the interference of the interfering source 2 to the electronic device 600 can be reduced.

As shown in FIG. 20, the foregoing switching device 84 may be a field effect transistor. A source and a drain of the field effect transistor are connected to the branch circuit 83, a gate of the field effect transistor is connected to the processor 9, and the processor 9 can control the field effect transistor to be turned on or turned off. Certainly, in addition to a field effect transistor, the switching device 84 may alternatively be a transistor.

In some embodiments, as shown in FIG. 20, a phase modulation device 82 is disposed on each branch circuit 83. This ensures that a phase of a current in each branch circuit 83 is consistent with a phase of a current in the current circuit 20 corresponding to the load 22, so as to minimize the magnetic induction intensity in a device disposing space 3.

Figure 21:
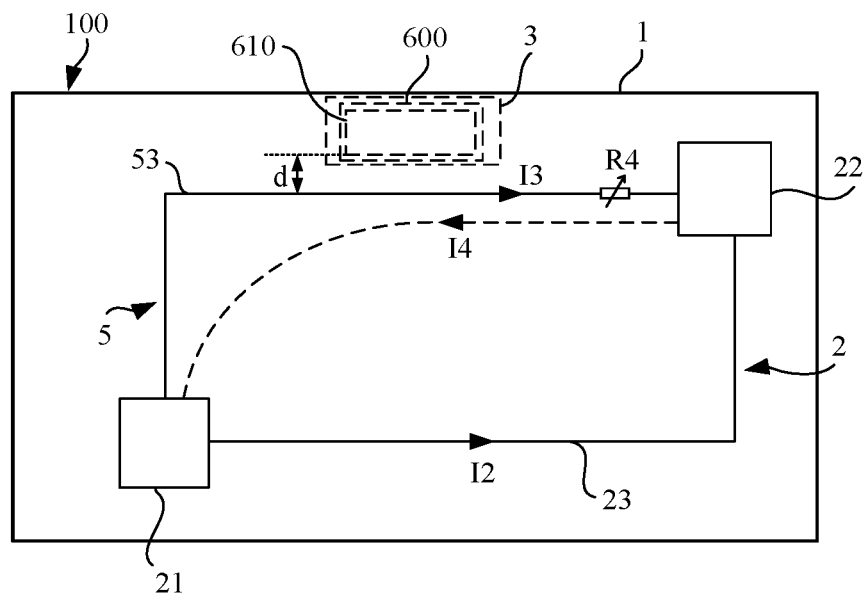
FIG. 21 is a schematic diagram of a structure of an anti-interference module according to some other embodiments of this application.
Figure 22:
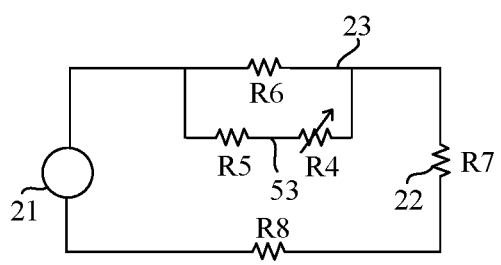
FIG. 22 is a diagram of an equivalent circuit of an anti-interference module in FIG. 21.

As shown in FIG. 21 and FIG. 22, FIG. 21 is a schematic diagram of a structure of an anti-interference module 100 according to some other embodiments of this application: and FIG. 22 is a diagram of an equivalent circuit of an anti-interference module 100 in FIG. 21. A main difference between this anti-interference module 100 and the anti-interference module 100 in FIG. 4 to FIG. 20 lies in a different structure of the anti-interference component 5.

The anti-interference component 5 includes a compensation line 53. The compensation line 53 is connected between the second alternating current power supply unit 21 and the load 22, and a flow direction of a current I3 in the compensation line 53 is opposite to the flow direction of a current I2 in the connection line 23. As shown in FIG. 21, the flow direction of a current I3 in the compensation line 53 is clockwise, and the flow direction of a current I2 in the connection line 23 is counterclockwise.

When the interfering source 2 works, the second alternating current power supply unit 21 supplies energy to the load 22 by using the connection line 23, and the energy flows back to the second alternating current power supply unit 21 through a ground-plane path (as shown by a dashed line in FIG. 21). In this way, an enclosed interference magnetic field is generated around a current I4 on the ground-plane path, and consequently, the interference magnetic field can cause specific interference to the electronic device 600 in the device disposing space 3. The flow direction of a current I3 in the compensation line 53 is opposite to the flow direction of a current I2 in the connection line 23. In this way, the flow direction of a current I3 in the compensation line 53 may be opposite to a flow direction of the current I4 on the ground-plane path, and in the device disposing space 3, a magnetic flux of a compensation magnetic field generated by the current I3 can offset the magnetic flux of the interference magnetic field. Therefore, the magnetic induction intensity of the device disposing space 3 can be reduced, so as to reduce the interference of the interference magnetic field to the electronic device 600.

In FIG. 22, R5 is an impedance of the compensation line 53, R6 is an impedance of the connection line 23, R7 is an impedance of the load 22, and R8 is an impedance of the ground-plane path.

In some embodiments, as shown in FIG. 21, the anti-interference component 5 further includes a variable resistor R4, and the variable resistor R4 is disposed on the compensation line 53. In this way, by adjusting a resistance value of the variable resistor R4, a value of the current I3 may be adjusted, so that in the device disposing space 3, the magnetic flux of a compensation magnetic field generated by the current I3 can offset the magnetic flux of the interference magnetic field to the maximum extent, thereby reducing the interference that the interference magnetic field can cause to the electronic device 600.

The resistance value of the variable resistor R4 may be adjusted manually or automatically. This is not specifically limited herein.

In some embodiments, as shown in FIG. 21, a part of the compensation line 53 is disposed close to the device disposing space 3. For example, a minimum distance d between an orthographic projection of the compensation line 53 on the circuit board 1 and an orthographic projection of the first coil 610 on the circuit board 1 is less than or equal to 10 mm.

Based on such disposing, strength of the compensation magnetic field generated by the current I3 in the device disposing space 3 may be increased, so that in the device disposing space 3, the magnetic flux of a compensation magnetic field generated by the current I3 can better offset the magnetic flux of the interference magnetic field, thereby reducing the interference that the interference magnetic field can cause to the electronic device 600.

It can be learned from the foregoing embodiments that the anti-interference component 5 generates a compensation magnetic field that overlaps the interference magnetic field, or consumes the electric energy generated by coupling between the interference magnetic field and the anti-interference component 5, and therefore magnetic induction intensity of the device disposing space 3 can be reduced, so as to reduce the interference of the interference magnetic field to the electronic device 600.

Figure 23:
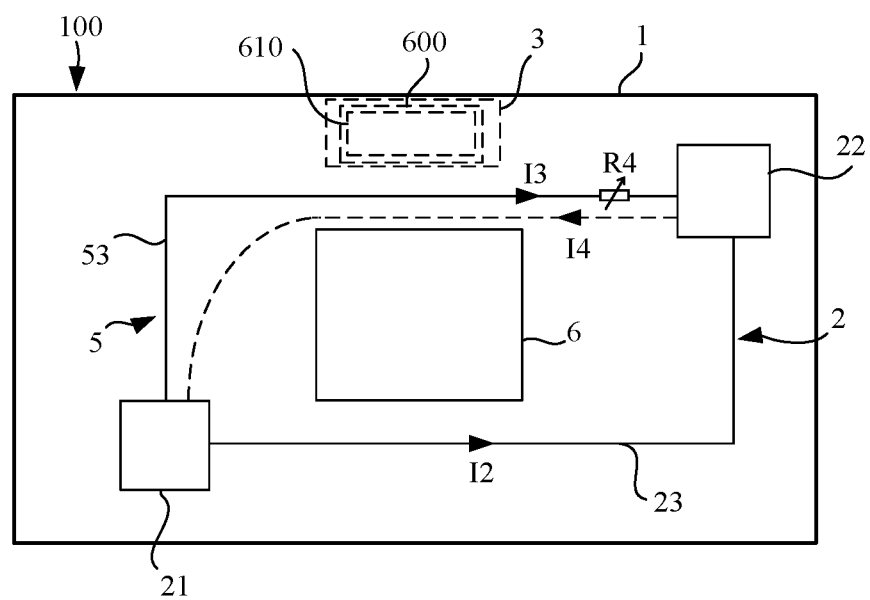
FIG. 23 is a schematic diagram of a structure of an anti-interference module according to some other embodiments of this application.

In some embodiments, as shown in FIG. 23, FIG. 23 is a schematic diagram of a structure of an anti-interference module 100 according to some other embodiments of this application. An avoidance hole 6 for avoiding a camera is disposed on the circuit board 1. In this way, the avoidance hole 6 can limit a position of the camera to some extent. This not only facilitates mounting and positioning of the camera, and prevents the camera from shaking greatly.

As shown in FIG. 23, the avoidance hole 6 may be disposed in an area enclosed by the connection line 23 and the ground-plane path (as shown by a dashed line in the figure).

Figure 24:
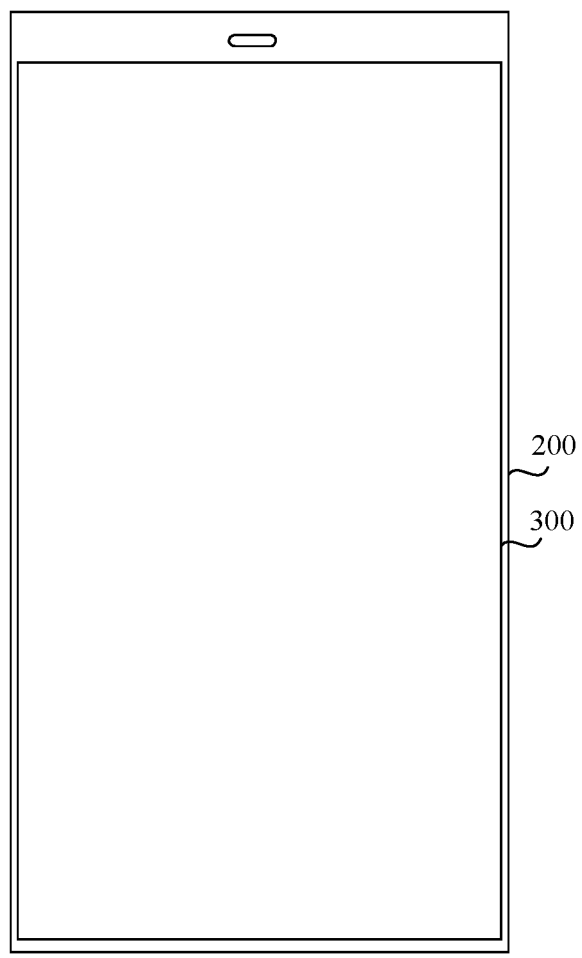
FIG. 24 is a front view of a mobile phone according to some other embodiments of this application.
Figure 25:
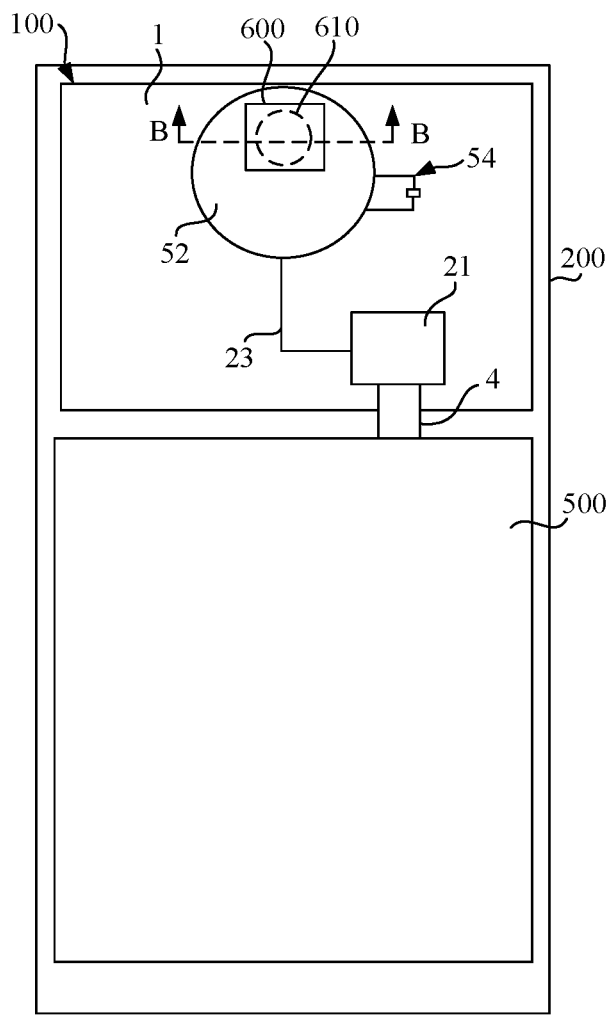
FIG. 25 is a schematic diagram of a structure of a mobile phone in FIG. 24 with a display removed.
Figure 26:
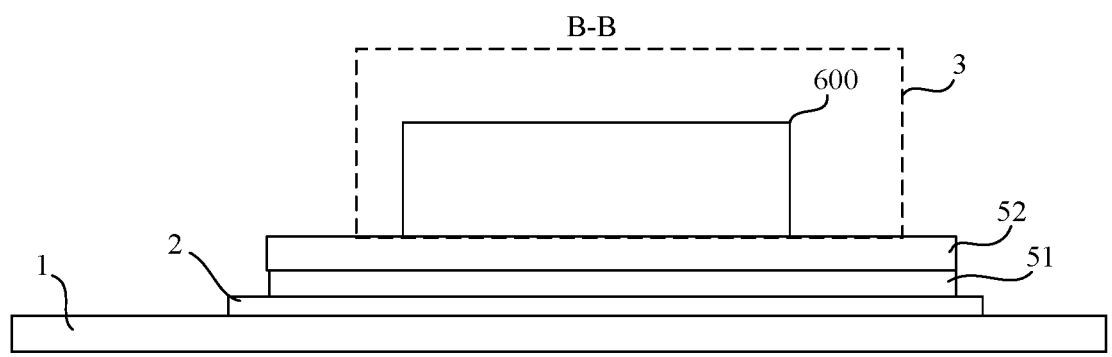
FIG. 26 is a cross sectional view taken along B-B of FIG. 25.

As shown in FIG. 24, FIG. 25, and FIG. 26, FIG. 24 is a front view of a mobile phone according to some other embodiments of this application: FIG. 25 is a schematic diagram of a structure of a mobile phone in FIG. 24 with a display 300 removed: and FIG. 26 is a cross sectional view taken along B-B of FIG. 25. A main difference between the mobile phone in this embodiment and the mobile phone in FIG. 1 to FIG. 23 is that this mobile phone is a bar phone, and the electronic device 600 is mounted in a device disposing space 3.

Specifically, the mobile phone includes a housing 200, a display 300, an anti-interference module 100, an electronic device 600, and a power supply 500.

The display 300 is disposed on the housing 200. A circuit board 1 of the anti-interference module 100 is disposed in the housing 200 and is electrically connected to the power supply 500.

The electronic device 600 is an audio player. The electronic device 600 is disposed in the housing 200, and is mounted in the device disposing space 3. For example, as shown in FIG. 23, in a thickness direction of the circuit board 1, an interfering source 2, a second coil 51, a magnetic field shielding element 52, and the electronic device 600 are sequentially disposed on the circuit board 1. Based on the foregoing disposing, the electronic device 600 and the anti-interference module 100 are located in the housing 200, and the electronic device 600 is closer to the second coil 51 and the magnetic field shielding element 52. Therefore, the second coil 51 and the magnetic field shielding element 52 can better avoid interference of the interfering source 2 to the electronic device 600.

For another structure of the anti-interference module 100, refer to the structure setting in FIG. 4 to FIG. 20. Details are not described herein again.

Certainly, in addition to the audio player, the electronic device 600 in this embodiment of this application may be another electronic device 600 that is susceptible to interference from a magnetic field. For example, the electronic device 600 may alternatively be an electronic device 600 with a first coil, such as a phone receiver. The electronic device 600 with a coil is more susceptible to interference of an interference magnetic field generated by the interfering source 2, and therefore the electronic device 600 is disposed in the device disposing space 3. In this way, the anti-interference component 5 can better avoid the interference of the interfering source 2 to the electronic device 600, so as to ensure normal operation of the electronic device 600 with a coil.

In description of this specification, specific features, structures, materials or characteristics described may be combined in any one or more embodiments or examples in a suitable manner.

Finally, it should be noted that the foregoing embodiments are only used to illustrate the technical solutions of this application, but are not used to limit this application. Although this application has been described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the spirit and scope of the technical solutions of the embodiments of this application.

The invention claimed is:

1. A terminal device, comprising:
   a housing;
   an anti-interference module, comprising:
   a circuit board;
   an interfering source, disposed on the circuit board, wherein the interfering source may generate a changing interference magnetic field;
   a device disposing space, disposed on a side of the circuit board and used to dispose an electronic device with a first coil; and
   an anti-interference component, configured to generate a compensation magnetic field that overlaps the interference magnetic field, or to consume electric energy generated by coupling between the interference magnetic field and the anti-interference component to reduce magnetic induction intensity of the device disposing space, wherein the anti-interference component comprises:

a second coil, disposed on a side of the device disposing space; and a magnetic field shielding element, wherein at least a part of the magnetic field shielding element is located between the second coil and the device disposing space, and wherein the circuit board of the anti-interference module is disposed in the housing; and the electronic device, having the first coil and disposed in the housing.

2. An anti-interference module, comprising:

a circuit board;

an interfering source, disposed on the circuit board, wherein the interfering source may generate a changing interference magnetic field;

a device disposing space, disposed on a side of the circuit board and used to dispose an electronic device with a first coil; and an anti-interference component, configured to generate a compensation magnetic field that overlaps the interference magnetic field, or to consume electric energy generated by coupling between the interference magnetic field and the anti-interference component to reduce magnetic induction intensity of the device disposing space, wherein the anti-interference component comprises:

a second coil, disposed on a side of the device disposing space; and a magnetic field shielding element, wherein at least a part of the magnetic field shielding element is located between the second coil and the device disposing space.

3. The anti-interference module according to claim 2, wherein the second coil is disposed between the interfering source and the device disposing space.

4. The anti-interference module according to claim 3, wherein in a thickness direction of the circuit board, the device disposing space is provided on a side of the interfering source away from the circuit board.

5. The anti-interference module according to claim 3, wherein the second coil is a planar coil; and the magnetic field shielding element is layered and is disposed in lamination with the second coil.

6. The anti-interference module according to claim 2, wherein the interference magnetic field is a low-frequency alternating magnetic field, and a material of the magnetic field shielding element is a permeability magnetic material.

7. The anti-interference module according to claim 2, wherein the anti-interference component further comprises a charging circuit electrically connected to the second coil, the charging circuit comprises a charging connection end, and the charging connection end is configured to be electrically connected to a power supply.

8. The anti-interference module according to claim 2, wherein the anti-interference component further comprises an energy consuming circuit electrically connected to the second coil, and the energy consuming circuit is configured to consume electric energy generated by coupling between the second coil and the interference magnetic field.

9. The anti-interference module according to claim 8, wherein the energy consuming circuit is an RLC circuit.

10. The anti-interference module according to claim 8, wherein the interference magnetic field is a high-frequency alternating magnetic field, and the energy consuming circuit comprises a bead.

11. The anti-interference module according to claim 1, wherein the anti-interference component further comprises a connection circuit electrically connected to the second coil, the connection circuit comprises a power supply connection end, and the power supply connection end is configured to be electrically connected to an electrical device.

12. The anti-interference module according to claim 2, wherein the anti-interference module further comprises a first alternating current power supply unit, the first alternating current power supply unit is electrically connected to the second coil, so that the second coil can generate the compensation magnetic field, and a direction in which the compensation magnetic field passes through the second coil is opposite to a direction in which the interference magnetic field passes through the second coil.

13. The anti-interference module according to claim 12, wherein the interfering source comprises a load, a second alternating current power supply unit, and a connection line connected between the second alternating current power supply unit and the load; and a flow direction of a current in the second coil is opposite to a flow direction of a current in the connection line, wherein the flow direction comprises a clockwise direction and a counterclockwise direction.

14. The anti-interference module according to claim 13, wherein there are a plurality of loads, and each load is separately connected to the first alternating current power supply unit by using the connection line;

the anti-interference module further comprises a plurality of branch circuits, and a switching device disposed on each branch circuit; and first ends of the plurality of branch circuits are connected to a plurality of connection lines in a one-to-one correspondence, second ends of the plurality of branch circuits are electrically connected to one end of the second coil, and the other end of the second coil is electrically connected to the second alternating current power supply unit.

15. The anti-interference module according to claim 13, wherein the anti-interference module further comprises a phase modulation device connected between the first alternating current power supply unit and the second coil, and the phase modulation device is configured to adjust a phase of the current in the second coil, so that the phase of the current in the second coil is consistent with a phase of the current in the connection line.

16. The anti-interference module according to claim 13, wherein
the first alternating current power supply unit and the second alternating current power supply unit are a same power supply unit.

17. The anti-interference module according to claim 2, wherein
the interfering source comprises a load, a second alternating current power supply unit, and a connection line connected between the second alternating current power supply unit and the load; and
the anti-interference component comprises a compensation line, the compensation line is connected between the second alternating current power supply unit and the load, and a flow direction of a current in the compensation line is opposite to a flow direction of a current in the connection line, wherein the flow direction comprises a clockwise direction and a counter-clockwise direction.

18. The anti-interference module according to claim 17, wherein
the anti-interference component further comprises a variable resistor, and the variable resistor is disposed on the compensation line.

19. The anti-interference module according to claim 17, wherein
a part of the compensation line is disposed close to the device disposing space.

\* \* \* \* \*